(12) United States Patent
Kim

(10) Patent No.: US 7,476,613 B2
(45) Date of Patent: Jan. 13, 2009

(54) METHOD OF FORMING AN ELECTRICAL CONTACT IN A SEMICONDUCTOR DEVICE USING AN IMPROVED SELF-ALIGNED CONTACT (SAC) PROCESS

(75) Inventor: Hyung Hwan Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 202 days.

(21) Appl. No.: 11/594,640

(22) Filed: Nov. 8, 2006

(65) Prior Publication Data
US 2007/0275555 A1    Nov. 29, 2007

(30) Foreign Application Priority Data
May 24, 2006    (KR) .................... 10-2006-0046760

(51) Int. Cl.
*H01L 21/4763*    (2006.01)
(52) U.S. Cl. .................. 438/637; 438/597; 438/657; 438/671; 438/672; 438/675; 438/691; 438/692; 257/E21.257; 257/E21.507
(58) Field of Classification Search ............... 438/597, 438/637, 657, 671, 672, 675, 691, 692; 257/E21.257, 257/E21.507
See application file for complete search history.

(56) References Cited

U.S. PATENT DOCUMENTS 6,858,452 B2 *   2/2005   Park et al. .................... 438/14
7,115,491 B2 *  10/2006   Huang et al. ................ 438/586
7,119,015 B2 *  10/2006   Park et al. ................... 438/672
7,229,904 B2 *   6/2007   Kim ........................... 438/586
2006/0105569 A1 *  5/2006   Kim ........................... 438/675

FOREIGN PATENT DOCUMENTS

KR    1020050067550    7/2005
KR    1020050116490    12/2005

OTHER PUBLICATIONS

Notice of Preliminary Rejection from Korean Intellectual Property Office.

* cited by examiner

*Primary Examiner*—Andy Huynh
(74) *Attorney, Agent, or Firm*—Ladas & Parry LLP

(57) ABSTRACT

A contact for a semiconductor device is made by performing, inter alia, a CMP process on an interlayer insulation layer to expose a first hard mask layer of each conductive line. The interlayer insulation layer is partially removed. A second hard mask layer is formed on a resultant substrate. Another CMP process is performed on the second hard mask layer to expose the first hard mask layer of each conductive line. A hard mask pattern is formed by etching portions of the CMPed second hard mask layer. The interlayer insulation layer is etched by using the hard mask pattern as an etch barrier to open the contact forming regions of the substrate. A conductive layer is deposited on the resultant substrate to fill the opened contact forming regions. The conductive layer and the remaining hard mask pattern are removed to expose the first hard mask layer of each conductive line.

34 Claims, 17 Drawing Sheets

CENTER: ETCH LOSS LOW

ENDGE: ETCH LOSS HIGH

CENTER: ETCH LOSS LOW

ENDGE: ETCH LOSS HIGH

METHOD OF FORMING AN ELECTRICAL CONTACT IN A SEMICONDUCTOR DEVICE USING AN IMPROVED SELF-ALIGNED CONTACT (SAC) PROCESS

BACKGROUND OF THE INVENTION

1. Field of the Invention

The present invention relates, in general, to a method of manufacturing a semiconductor device, and more particularly to a method of forming a contact of a semiconductor device, which overcomes a number of problems encountered in semiconductor devices made from conventional SAC (self-aligned contact) process when forming an electrical contact.

2. Description of the Related Art

In a semiconductor memory device, such as in a DRAM device, an electrical connection between a capacitor and a bit line is often times implemented through a landing plug contact, a bit line contact and a storage node contact. These contact plugs are conventionally constructed by forming an interlayer insulation layer after forming gate lines or bit lines on a substrate, selectively etching the specific portion of the interlayer insulation layer which exists in each contact forming region, depositing a conductive layer, and finally implementing a SAC (self-aligned contact) process using chemically-mechanically polishing (hereinafter referred to as "CMPing") onto the resultant structure. Usually the objective of CMPing the resultant structure is to remove a portion of the conductive layer which exists on top of the interlayer insulation layer and to remove a predetermined portion of each gate line or bit line hard mask nitride layer so that any adjacent electrical connections are completely isolated from one another.

FIGS. 1A through 1F depict stylized cross-sectional views that illustrate some of the more common semiconductor manufacturing process steps encountered in conventional methods when forming landing plug electrical contacts.

Referring to FIG. 1A, a silicon substrate 1, in which active regions are delimited by a device isolation layer (not shown), is provided. A plurality of gate lines 5 are formed on the silicon substrate 1, in which each gate line 5 comprises a sequentially stacked structure composed of a gate insulation layer 2, a gate conductive layer 3 and a gate line hard mask nitride layer 4. Next, junction regions 6 are formed in the surface of the silicon substrate 1 along both sides of each gate line 5 by way of any number of ion implantation processes. Thereafter, a first spacer nitride layer 7 and a first interlayer insulation layer 8 are sequentially formed over the surface of the resultant silicon substrate 1 which results in covering the gate lines 5 and the junction regions 6.

Referring now to FIG. 1B, subsequent to CMPing the prior art structure depicted in FIG. 1a, a portion of the first interlayer insulation layer 8 and a portion of the first spacer nitride layer 7 are removed until a portion of the gate line hard mask nitride layers 4 is exposed.

Referring now to FIG. 1C, subsequent to forming a polysilicon layer (not shown) on top of a substantial portion of (i) the first interlayer insulation layer 8, (ii) the first spacer nitride layer 7 and (iii) the gate line hard mask nitride layer 4, a first polysilicon hard mask 9 is formed by patterning the polysilicon layer (not shown) to expose selected regions of (i) the first interlayer insulation layer 8, (ii) the gate lines 5, i.e., selected portions of the gate line hard mask nitride layer 4 and (iii) the first spacer nitride layer 7 in which these exposed regions define the active region, i.e., the region not covered by the first polysilicon hard mask.

Referring now to FIG. 2 which depicts a plan top view corresponding to FIG. 1C defined by line 1C-1C' in FIG. 2. As can be seen from FIG. 2, the first polysilicon hard mask 9 can be formed in such a way as to eventually be able to expose selected portions of the gate lines 5 as well as expose selected portions of the junction regions 6 that are located in the active regions, i.e., the active regions are those regions not covered by the first polysilicon hard mask 9.

Referring now to FIG. 1D, portions of the first interlayer insulation layer 8 are shown etched away which results in forming contact holes 11 for use in exposing portions of the underlying the gate lines 5 and the junction regions 6 through the first polysilicon hard mask 9. That is, by depositing a USG (undoped silicate glass) oxide layer 10 acting as a physical barrier, i.e., a buffer, and performing an etch-back process on the resultant structure 1, contact forming regions, that is, contact holes 11 can be made for use in exposing portions of the gate lines 5 and the underlying junction regions 6.

Referring now to FIG. 1E, next a first polysilicon layer 12 is usually deposed onto the resultant substrate 1 depicted in FIG. 1D. This first polysilicon layer 12 is usually designed to be a conductive layer for the eventual use as an electrical pathway.

Referring now to FIG. 1F, the first polysilicon layer 12, the USG oxide layer 10 acting as the buffer, and the first polysilicon hard mask 9 deposited on the resultant substrate, depicted in FIG. 1E, are then usually CMPed until a portion of the gate line hard mask nitride layer 4 is exposed. As a result, landing plug contacts 12a are formed on the exposed junction regions 6 situated between the exposed gate lines 5.

FIGS. 3A through 3E depict stylized cross-sectional views illustrating some of the more common process steps encountered when using conventional method for use in forming a storage node contact 21a.

Referring now to FIG. 3a, a silicon substrate 1 is shown having a number of landing plug contacts 12a which are formed through a first interlayer insulation layer 8. Also shown is an insulation layer 13 formed on top of both the landing plug contacts 12a and the first interlayer insulation layer 8. A plurality of bit lines 17 are shown formed on top of the insulation layer 13. Each bit line 17 is shown composed of a barrier layer 14, a conductive layer 15 and a bit line hard mask nitride layer 16 which are sequentially stacked upon one another. A second spacer nitride layer 18 and a second interlayer insulation layer 19 are sequentially formed over the insulation layer 13 and the bit lines 17.

Referring now to FIG. 3b, the second interlayer insulation layer 19 is then usually CMPed to a more planar surface and often times reduced to a predetermined thickness in which the remaining portion of the second interlayer insulation layer 19 is still left covering over the bit lines 17. Subsequent to forming a polysilicon layer (not shown) on top of this remaining portion of the second interlayer insulation layer 19, a second polysilicon hard mask 20 is formed by removing selected areas of the polysilicon layer (not shown) to produce the second polysilicon hard mask 20 which usually delimits the regions in which storage node contacts 21a (not shown) can be formed.

FIG. 4 depicts a stylized top plan view corresponding to FIG. 3B in which is defined by line 3B-3B' in FIG. 4. As can be readily seen from FIG. 4, the second polysilicon hard masks 20 can be formed in such a way as to expose selected portions of the second interlayer insulation layer 19 in which storage node contacts 21a (not shown) can be formed.

Referring now to FIG. 3C, exposed portions of (i) the second interlayer insulation layer 19, (ii) the second spacer nitride layer 18, (iii) the insulation layer 13, and (iv) the landing plug contacts 12a are shown where the second polysilicon hard mask 20 has been removed as an etch barrier and thus provides the active regions in which the storage node contacts 21a can be eventually formed.

Referring to FIG. 3D, a second polysilicon layer 21 is shown filling in an opened area (not shown) over the silicon substrate 1. This second polysilicon layer 21 can be modified to serve as an electrical conductive material defining a plug (not shown).

Referring now to FIG. 3E, which shows the second polysilicon layer 21 and the second polysilicon hard masks 20 having been CMPed until a portion of the bit line hard mask nitride layer 16 is exposed. As a result, storage node contacts 21a which are formed between the exposed bit lines 17 and which serve as electrical connections to the landing plug contacts 12a.

One particular problem with conventional methods may occur when forming the landing plug contacts 12a and the storage node contacts 21a is that there results in the unwanted loss of portions of the gate line and the bit line hard mask nitride layers (4 and 16, respectively) when the first and second interlayer insulation layers (8 and 19, respectively) are differentially etched away. Consequently, as shown in FIGS. 5 and 7, an undesirable thickness deviation may result between the opened area and the non-opened area of each of the gate line and bit line hard mask nitride layers (4 and 16, respectively). Due to this fact, when subsequently CMPing the polysilicon layers for plugs in an effort to isolate the landing plug contacts 12a and the storage node contacts 21a, a more homogeneous polishing thickness cannot be achieved.

Moreover, since this undesirable thickness variation of the gate line and bit line hard mask nitride layers (4 and 16, respectively) is dependent upon the opened and non-opened areas on any given wafer circuit design then the polishing thickness must be further increased to assure that complete electrical isolation can be achieved for all of the various electrical contacts throughout the entirety of that given wafer. Therefore, the polishing thicknesses of the CMP process are undesirably increased to prevent the possibility that non-uniformity in the gate line and bit line hard mask nitride layers (4 and 16, respectively) are not shorted.

Referring now to FIG. 6 which are photographs illustrating contact loss difference induced in a wafer after conducting a CMP process for isolating landing plug contacts 12a in the conventional method.

Referring now to FIG. 8 which are photographs illustrating a contact loss difference induced in a wafer after conducting a CMP process for isolating storage node contacts 21a in the conventional method.

Referring now to both to FIGS. 6 and 8, it is to be readily understood that a contact loss difference between the center portion and the peripheral portion of a wafer is substantial. That is to say, the contact loss of the center portion of the wafer is larger than that of the peripheral portion of the wafer.

SUMMARY OF THE INVENTION

Accordingly, the present invention has been made in an effort to solve or at least minimize some of the problems that are encountered in the related art, and an aspect of the present invention is to provide a method for forming a contact of a semiconductor device which can decrease the thickness deviation of a hard mask nitride layer when forming a contact.

Another aspect of the present invention is to provide a method for forming a contact of a semiconductor device which can decrease the polishing thickness of a conductive layer for a plug by decreasing the thickness deviation of a hard mask nitride layer.

Still another aspect of the present invention is to provide a method for forming a contact of a semiconductor device which can improve uniformity of a wafer by decreasing the polishing thickness of a conductive layer for a plug.

In order to achieve the above and other aspects of the present invention, there is provided a method of forming a contact for a semiconductor device comprising: the steps of preparing a silicon substrate on which a plurality of conductive lines each having a first hard mask layer are formed; forming an interlayer insulation layer on the silicon substrate to cover the conductive lines; CMPing the interlayer insulation layer to expose the first hard mask layer of each conductive line; removing a partial thickness of the interlayer insulation layer; forming a second hard mask layer on the resultant substrate with the partial thickness of the interlayer insulation layer removed; CMPing the second hard mask layer to expose the first hard mask layer of each conductive line; forming a hard mask pattern by etching portions of the CMPed second hard mask layer which exist in contact forming regions; etching the interlayer insulation layer using the hard mask pattern as an etch barrier to open the contact forming regions of the substrate; depositing a conductive layer on the resultant substrate to fill the opened contact forming regions; and removing the conductive layer and the remaining hard mask pattern to expose the first hard mask layer of each conductive line.

According to another aspect of the present invention, the conductive lines comprise gate lines or bit lines.

According to another aspect of the present invention, the opened contact forming regions are junction regions between gate lines.

According to another aspect of the present invention, the opened contact forming regions are landing plug contact (such as 12a) regions between bit lines (such as 17).

According to another aspect of the present invention, the interlayer insulation layer is removed by 300~1,000 Å when forming landing plug contacts (such as 12a).

According to another aspect of the present invention, the interlayer insulation layer is removed by 100~1,000 Å when forming storage node contacts (such as 21a).

According to another aspect of the present invention, the first hard mask layer comprises a nitride layer, the interlayer insulation layer comprises an oxide layer, and the second hard mask layer comprises a polysilicon layer.

According to another aspect of the present invention, the step of CMPing the interlayer insulation layer is implemented using a slurry having a polishing selectivity of the first hard mask layer to the interlayer insulation layer of 1:10~1:200, and the first hard mask layer comprises a nitride layer and the interlayer insulation layer comprises an oxide layer.

According to another aspect of the present invention, the step of CMPing the second hard mask layer is implemented using a slurry having a polishing selectivity of the first hard mask layer to the second hard mask layer of 1:10~1:200, and the first hard mask layer comprises a nitride layer and the second hard mask layer comprises a polysilicon layer.

According to another aspect of the present invention, the conductive layer for filling the opened contact forming regions comprises a polysilicon layer in the case of forming landing plug contacts (such as 12a).

According to another aspect of the present invention, the conductive layer for filling the opened contact forming regions comprises a polysilicon layer or a tungsten layer in the case of forming storage node contacts (such as 21a).

According to another aspect of the present invention, the step of removing the conductive layer and the remaining hard mask pattern is implemented by an etch-back process or a CMP process.

In order to achieve the above and other aspects of the present invention, there is provided a method for forming a contact for a semiconductor device, comprising the steps of preparing a silicon substrate on which a plurality of gate lines each having a first hard mask layer and junction regions are formed; forming an interlayer insulation layer on the silicon substrate to cover the gate lines and the junction regions; CMPing the interlayer insulation layer to expose the first hard mask layer of each gate line; removing a partial thickness of the interlayer insulation layer; forming a second hard mask layer on the resultant substrate with the partial thickness of the interlayer insulation layer removed; CMPing the second hard mask layer to expose the first hard mask layer of each gate line; forming a hard mask pattern by etching portions of the CMPed second hard mask layer which exist in contact forming regions; etching the interlayer insulation layer using the hard mask pattern as an etch barrier to open the contact forming regions between the gate lines; depositing a conductive layer on the resultant substrate to fill the opened contact forming regions; and removing the conductive layer and the remaining hard mask pattern to expose the first hard mask layer of each gate line.

According to another aspect of the present invention, the interlayer insulation layer is removed by 300~1,000 Å.

According to another aspect of the present invention, the first hard mask layer comprises a nitride layer, the interlayer insulation layer comprises an oxide layer, and the second hard mask layer comprises a polysilicon layer.

According to another aspect of the present invention, the step of CMPing the interlayer insulation layer is implemented using a slurry having a polishing selectivity of the first hard mask layer to the interlayer insulation layer of 1:10~1:200, and the first hard mask layer comprises a nitride layer and the interlayer insulation layer comprises an oxide layer.

According to another aspect of the present invention, the step of CMPing the second hard mask layer is implemented using a slurry having a polishing selectivity of the first hard mask layer to the second hard mask layer of 1:10~1:200, and the first hard mask layer comprises a nitride layer, and the second hard mask layer comprises a polysilicon layer.

According to another aspect of the present invention, the conductive layer for filling the opened contact forming regions comprises a polysilicon layer.

According to another aspect of the present invention, the step of removing the conductive layer and the remaining hard mask pattern is implemented by an etch-back process or a CMP process.

In order to achieve another aspect of the present invention, there is provided a method for forming a contact for a semiconductor device, comprising the steps of preparing a silicon substrate on which a plurality of bit lines each having a first hard mask layer; forming an interlayer insulation layer on the silicon substrate to cover the bit lines; CMPing the interlayer insulation layer to expose the first hard mask layer of each bit line; removing a partial thickness of the interlayer insulation layer; forming a second hard mask layer on the resultant substrate with the partial thickness of the interlayer insulation layer removed; CMPing the second hard mask layer to expose the first hard mask layer of each bit line; forming a hard mask pattern by etching portions of the CMPed second hard mask layer which exist in contact forming regions; etching the interlayer insulation layer using the hard mask pattern as an etch barrier to open the contact forming regions between the bit lines; depositing a conductive layer on the resultant substrate to fill the opened contact forming regions; and removing the conductive layer and the remaining hard mask pattern to expose the first hard mask layer of each bit line.

According to another aspect of the present invention, the interlayer insulation layer is removed by 100~1,000 Å.

According to another aspect of the present invention, the first hard mask layer comprises a nitride layer, the interlayer insulation layer comprises an oxide layer, and the second hard mask layer comprises a polysilicon layer.

According to another aspect of the present invention, the step of CMPing the interlayer insulation layer is implemented using a slurry having a polishing selectivity of the first hard mask layer to the interlayer insulation layer of 1:10~1:200, and the first hard mask layer comprises a nitride layer and the interlayer insulation layer comprises an oxide layer.

According to another aspect of the present invention, the step of CMPing the second hard mask layer is implemented using a slurry having a polishing selectivity of the first hard mask layer to the second hard mask layer of 1:10~1:200, and the first hard mask layer comprises a nitride layer and the second hard mask layer comprises a polysilicon layer.

According to still another aspect of the present invention, the conductive layer for filling the opened contact forming regions comprises a polysilicon layer or a tungsten layer.

According to yet still another aspect of the present invention, the step of removing the conductive layer and the remaining hard mask pattern is implemented by an etch-back process or a CMP process.

BRIEF DESCRIPTION OF THE DRAWINGS

The above aspects, and other features and advantages of the present invention will become more apparent after a reading of the following detailed description when taken in conjunction with the drawings, in which.

DETAILED DESCRIPTION OF PREFERRED EMBODIMENTS

Figure 1A:
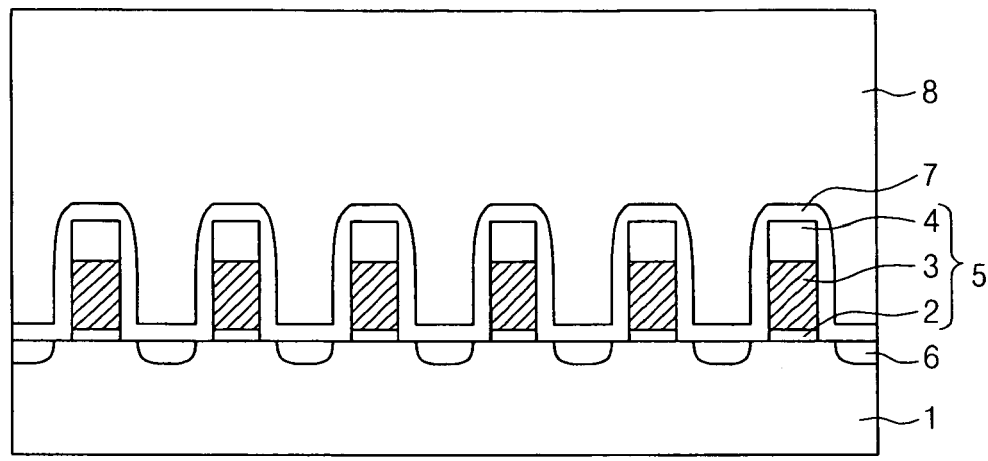
FIGS. 1A through 1F are cross-sectional views illustrating the process steps of a conventional method for forming a landing plug contact.
Figure 1B:
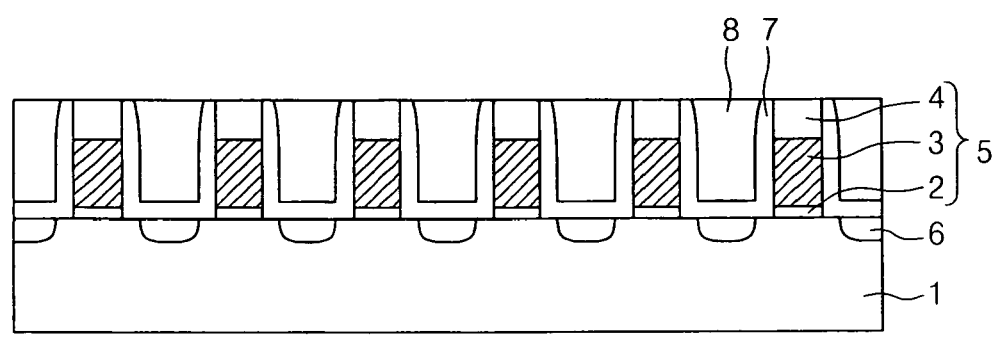
Figure 1C:
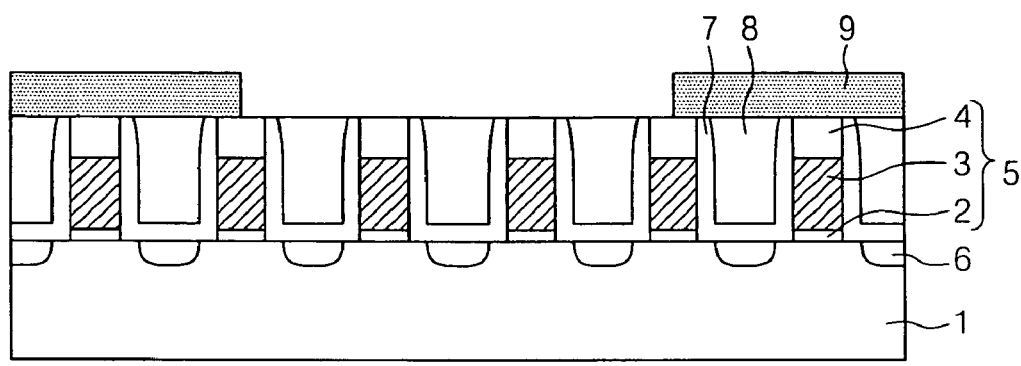

Reference will now be made in greater detail to preferred embodiments of the invention, examples of which are illustrated in the accompanying drawings.

First describing the technical principle of the present invention, the present invention can be characterized by the fact that, when forming a landing plug contact 12a and a storage node contact 21a, a polysilicon hard mask pattern is only formed on an interlayer insulation layer such that entire gate lines and bit lines are opened.

In this case, even though the loss of a hard mask nitride layer is still brought about when subsequently etching the interlayer insulation layer, the degree of the loss can be equally maintained over the entire gate lines and bit lines. Accordingly, the thickness deviation or variation of the hard mask nitride layer can be considerably decreased in comparison to those made with the presently known conventional art techniques. This is because portions of the gate lines and the bit lines existing in active regions are selectively exposed when using these presently known conventional techniques and thereby the thickness variations of the hard mask nitride layer result in substantial problems.

Therefore, in an embodiment of the present invention, because the thickness deviation of the hard mask nitride layer can be minimized, the polishing thickness of a conductive layer for a plug can also be minimized. Whereby the uniformity of the wafer can be improved and thus the manufacturing efficiency in producing acceptable chips can be likewise enhanced.

Hereafter, methods for forming a landing plug contact 12a and a storage node contact 21a of a semiconductor device will be described in detail.

FIGS. 9A through 9G are cross-sectional views illustrating the process steps of a method for forming a landing plug contact 12a in accordance with an embodiment of the present invention. In the following descriptions, the component parts which are the same as those shown in FIGS. 1a through 1f will be designated by the same reference numerals.

Figure 9A:
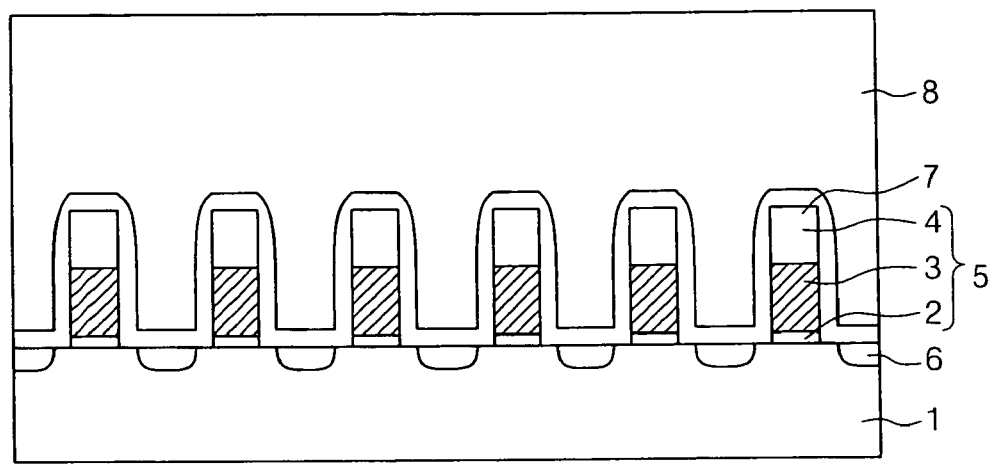
FIGS. 9A through 9G are cross-sectional views illustrating the process steps of a method for forming a landing plug contact in accordance with an embodiment of the present invention.

Referring to FIG. 9A, a silicon substrate 1, in which active regions are delimited by a device isolation layer (not shown), is provided. Then, after sequentially forming a gate insulation layer 2, a gate conductive layer 3 and a gate line hard mask nitride layer 4 on the silicon substrate 1, by patterning the layers 2, 3 and 4, a plurality of conductive lines, that is, gate lines 5 are formed.

Next, junction regions 6 are formed in the surface of the substrate 1 the sides of each exposed gate line 5 through an ion implantation process. Thereafter, a spacer nitride layer 7 is formed on the entire surface of the resultant substrate 1 with the junction regions 6 formed, and a first interlayer insulation layer 8 comprising an oxide layer is formed on the spacer nitride layer 7.

Figure 9B:
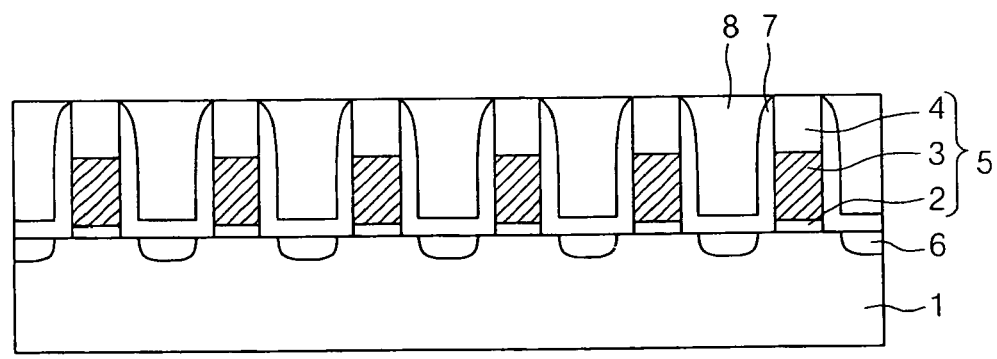

Referring to FIG. 9B, the first interlayer insulation layer 8 is CMPed employing the gate line hard mask nitride layer 4 as a polishing stop layer and preferably using a slurry having a high polishing selectivity with respect to a nitride layer, particularly, a polishing selectivity of 1:10~1:200 between a nitride layer and an oxide layer.

Figure 9C:
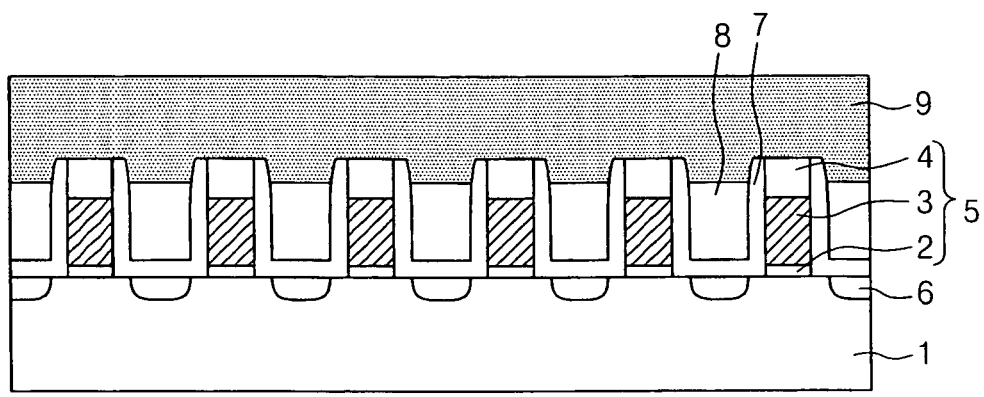

Referring to FIG. 9C, by implementing a wet etch process or a dry etch process on the resultant substrate 1 with the first interlayer insulation layer 8 CMPed, a predetermined thickness, for example, 100~1,000 Å and preferably, 300~1,000 Å, of the first interlayer insulation layer 8 can be removed so that the upper portion of each gate line hard mask nitride layer 4 of each gate line 5 is exposed. Next, a first polysilicon layer 9 for a hard mask is formed on the resultant substrate 1 to be used as an etch barrier when subsequently etching the first interlayer insulation layer 8.

Figure 9D:
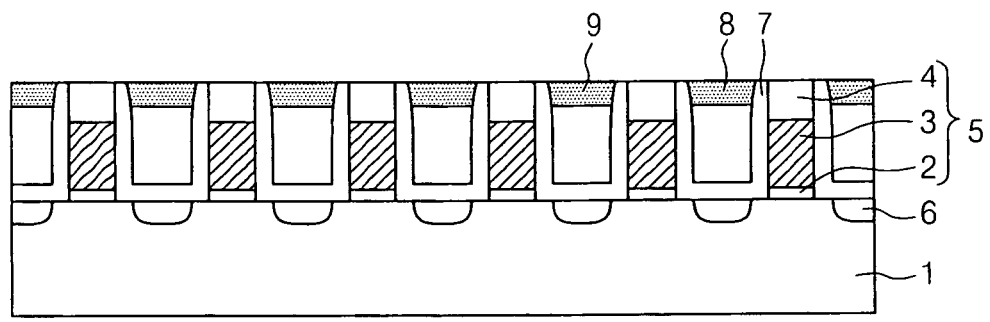

Referring to FIG. 9D, the first polysilicon layer 9 for a hard mask is CMPed using a slurry having a high polishing selectivity with respect to a nitride layer, particularly, a polishing selectivity of 1:10~1:200 between a nitride layer and a polysilicon layer, until the gate line hard mask nitride layer 4 of each gate line 5 is exposed. In this way, the first polysilicon layer 9 for a hard mask is left on the first interlayer insulation layer 8 between the gate lines 5.

Figure 9E:
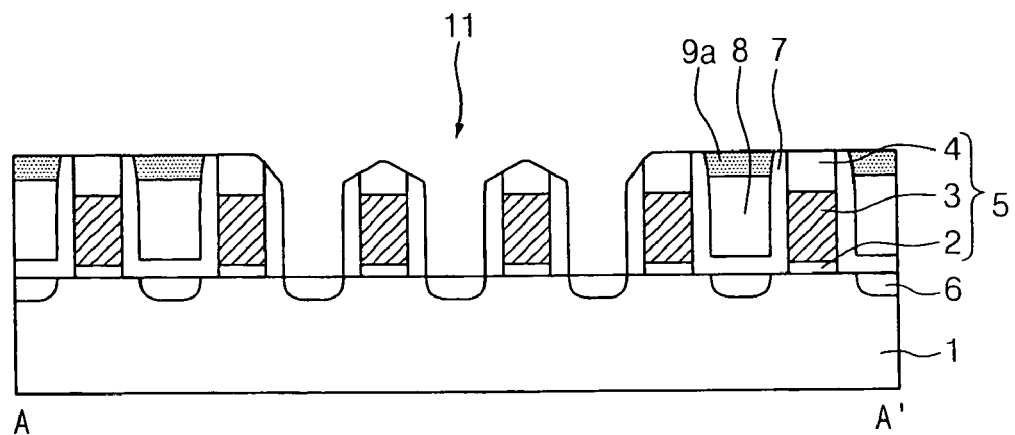

Referring to FIG. 9E, a mask pattern (not shown) for exposing landing plug contact 12a forming regions is formed on the resultant substrate 1 with the CMPed first polysilicon layer 9 for a hard mask by implementing a conventional process. At this time, the mask pattern is formed in the shape of a line. Then, the first polysilicon layer 9 for a hard mask is etched using the mask pattern as an etch mask to form a first polysilicon hard mask pattern 9a. Thereupon, after removing the mask pattern, the first interlayer insulation layer 8 is etched using the first polysilicon hard mask pattern 9a as an etch barrier. Thereafter, by depositing a USG oxide layer (not shown) for a buffer and conducting an etch-back process on the resultant structure, contact holes 11 for simultaneously exposing the gate lines 5 and the junction regions 6 which exist in the landing plug contact 12a forming regions are formed.

Figure 10:
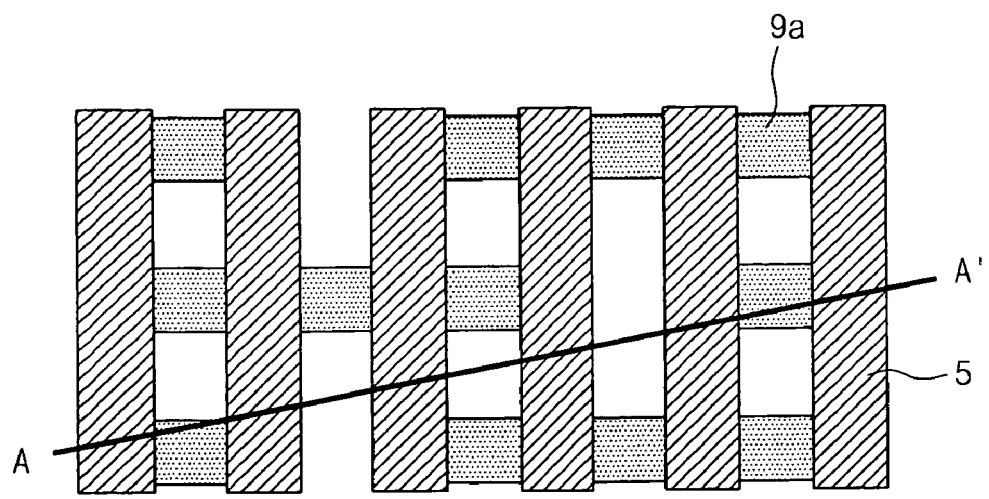
FIG. 10 is a plan view corresponding to FIG. 9E.

Here, as can be readily seen from FIG. 10, in an embodiment of the present invention, since the first polysilicon hard mask pattern 9a is not formed on the gate line hard mask nitride layer 4 of each gate line 5 and is only formed on the portions of the first interlayer insulation layer 8 which will not be opened, the entire gate lines 5 are exposed. Also, because the first polysilicon hard mask pattern 9a is formed on the portions of the first interlayer insulation layer 8 of which the predetermined thickness is removed, the upper surface of the first polysilicon hard mask pattern 9a is flush with the upper surfaces of the gate lines 5 including the gate line hard mask nitride layer 4.

Accordingly, in an embodiment of the present invention, since the first polysilicon hard mask pattern 9a to be used as an etch barrier when implementing an etching process for forming landing plug contacts 12a is formed to expose the entire gate lines 5, when implementing the etching process, the loss of the gate line hard mask nitride layer 4 occurs to the same extent over the entire gate lines 5. Therefore, in an embodiment of the present invention, it is possible to minimize a thickness deviation of the gate line hard mask nitride layer 4 in the gate lines 5.

Figure 9F:
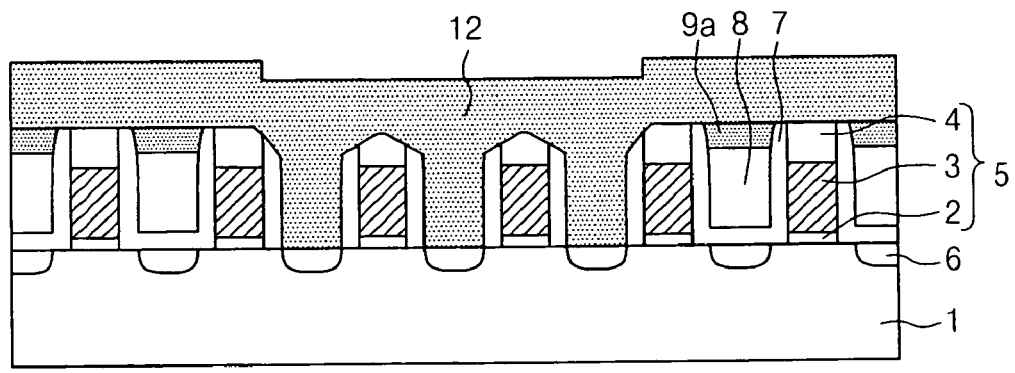

Referring to FIG. 9F, a polysilicon layer 12 serving as a conductive layer for a plug is deposited on the resultant substrate 1 to fill the contact holes 11.

Figure 9G:
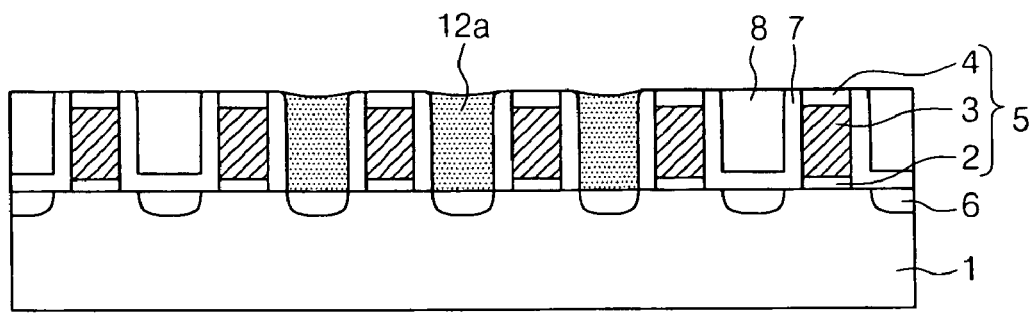

Referring to FIG. 9G, the polysilicon layer 12 and the remaining first polysilicon hard mask pattern 9a are removed to expose the gate line hard mask nitride layer 4 of each gate line 5, as a result of which landing plug contacts 12a are formed on the junction regions 6 between the gate lines 5. At this time, the removal of the polysilicon layer 12 and the remaining first polysilicon hard mask pattern 9a is preferably implemented through a CMP process, and it is possible to use an etch-back process instead of the CMP process.

Therefore, in an embodiment of the present invention, since the thickness deviation of the gate line hard mask nitride layer 4 in the gate lines 5 is minimized, a polishing thickness can be minimized when CMPing the polysilicon layer 12. Consequently, in an embodiment of the present invention, as the remaining thickness of the gate line hard mask nitride layer 4 can be stably secured, it is possible to minimize the polishing thickness of the conductive layer for a plug, and the uniformity of a wafer can be improved.

FIGS. 11A through 11F are cross-sectional views illustrating the process steps of a method for forming a storage node contact 21a in accordance with another embodiment of the present invention.

Figure 11A:
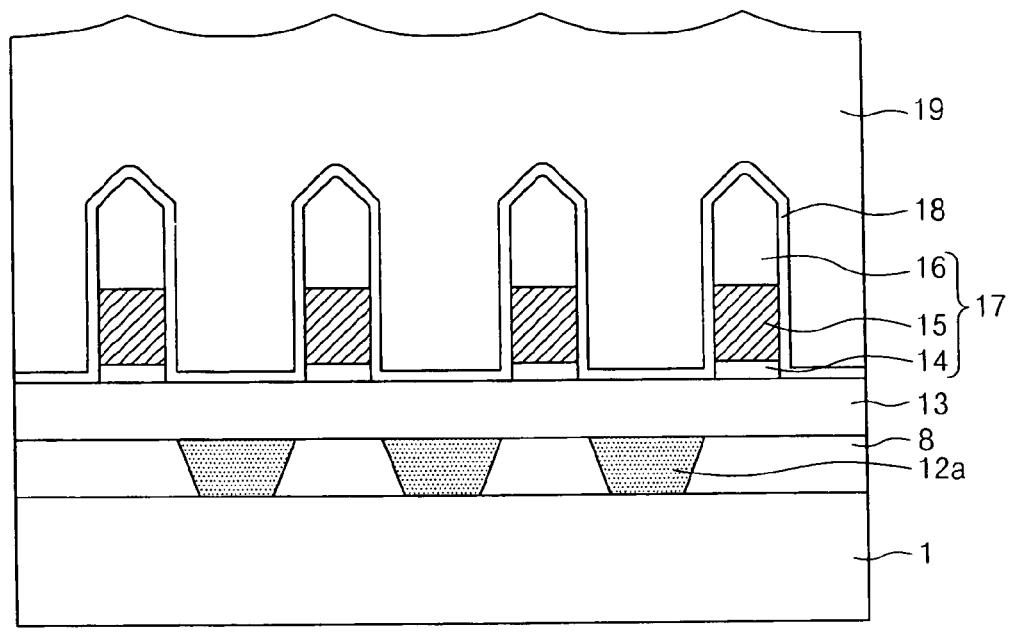
FIGS. 11A through 11E are cross-sectional views illustrating the process steps of a method for forming a storage node contact in accordance with another embodiment of the present invention.

Referring to FIG. 11A, after an insulation layer 13 is formed on a silicon substrate 1 on which a first interlayer insulation layer 8 including landing plug contacts 12a is formed, the insulation layer 13 is etched to form bit line contact holes (not shown) such that the landing plug contacts 12a are exposed in the bit line contact regions. Then, a plurality of conductive lines, that is, bit lines 17, in each of which a barrier layer 14, a conductive layer 15 and a bit line hard mask nitride layer 16 are sequentially stacked upon one another, are formed on the insulation layer 13 including the bit line contact holes. Next, after a spacer nitride layer 18 is formed on the insulation layer 13 including the bit lines 17, a second interlayer insulation layer 19 comprising an oxide layer is formed on the spacer nitride layer 18.

Figure 11B:
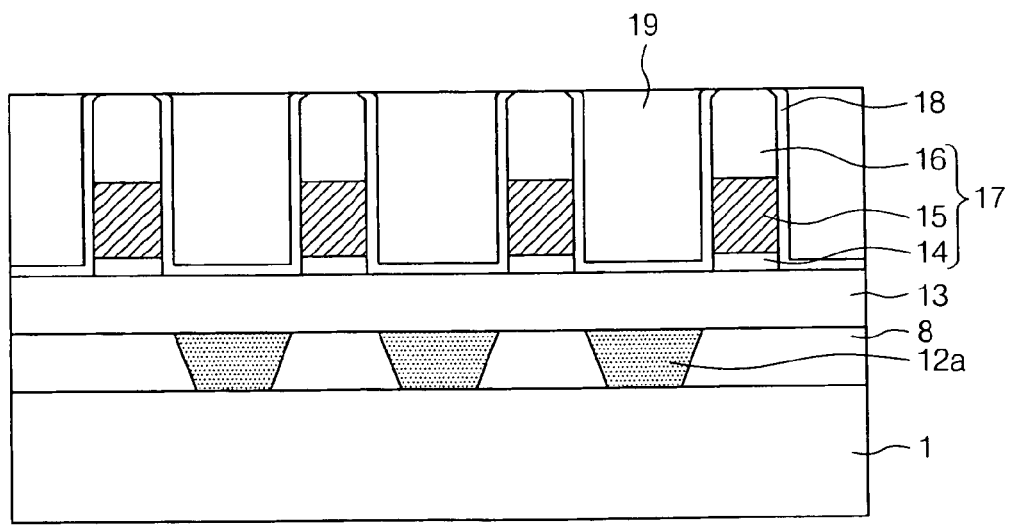

Referring to FIG. 11B, the second interlayer insulation layer 19 is CMPed to expose the bit line hard mask nitride layer 16 of each bit line 17. At this time, the second interlayer insulation layer 19 is CMPed employing the bit line hard mask nitride layer 16 as a polishing stop layer and using a slurry having a high polishing selectivity of 1:10~1:200 between a nitride layer and an oxide layer.

Figure 11C:
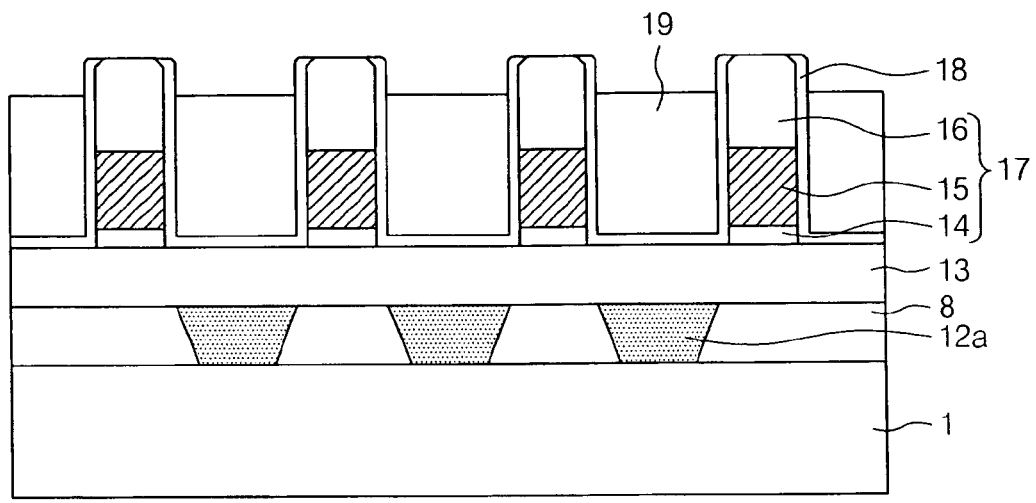
Figure 11D:
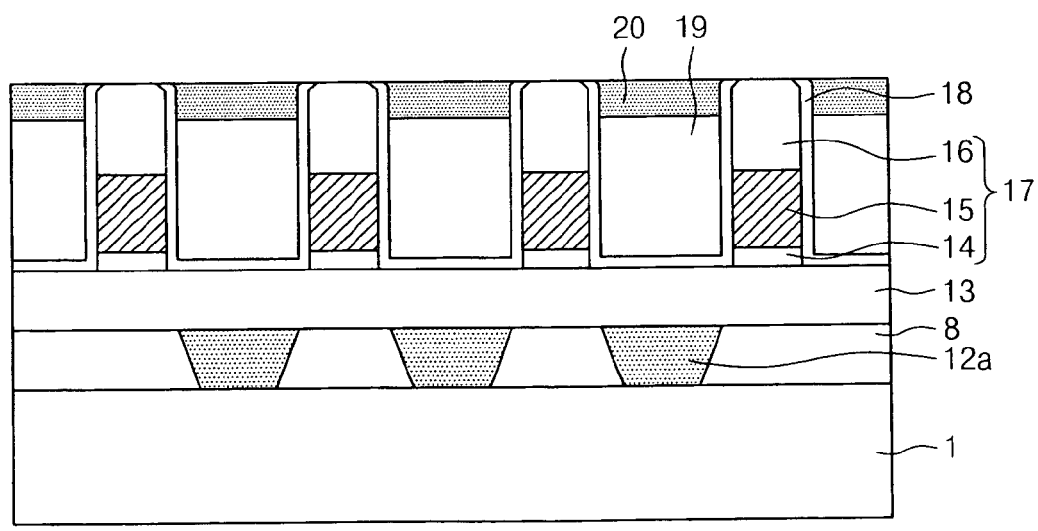
Figure 11E:
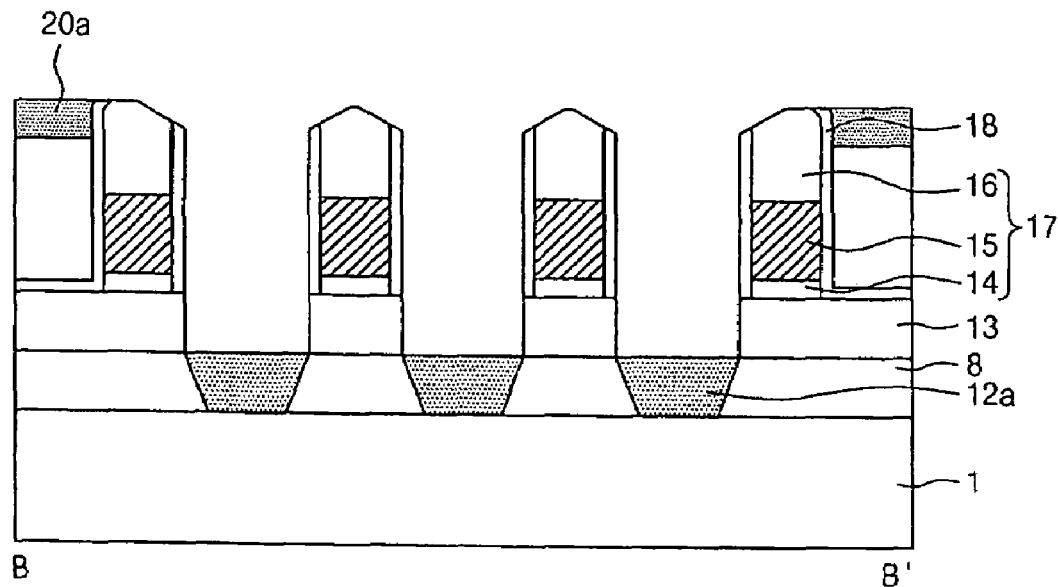

Referring to FIG. 11C, by implementing a wet etch process or a dry etch process for the resultant substrate 1 with the second interlayer insulation layer 19 CMPed, a predetermined thickness, for example, 100~1,000 Å, of the second interlayer insulation layer 19 is removed such that the upper portion of each bit line hard mask nitride layer 16 of each bit line 17 is exposed.

Figure 1D:
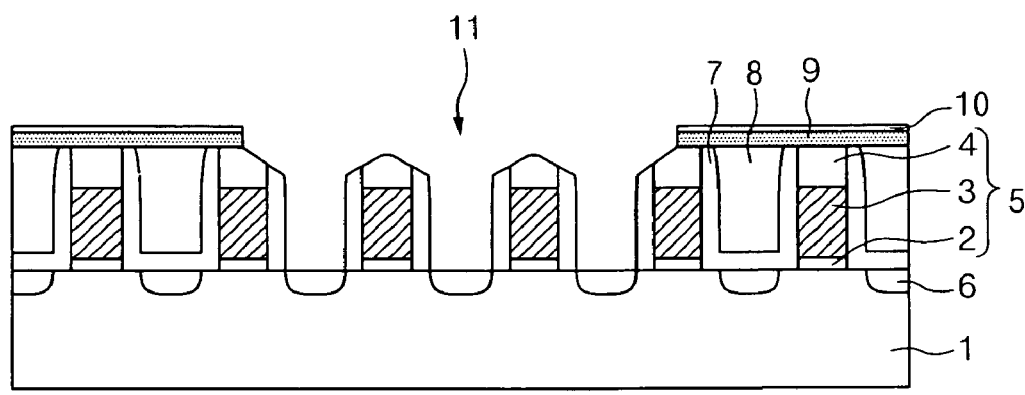

Referring to FIG. 1D, a second polysilicon layer 20 for a hard mask is formed on the resultant substrate 1 to be used as an etch barrier when subsequently etching the second interlayer insulation layer 19. Thereafter, the second polysilicon layer 20 for a hard mask is CMPed using a slurry having a high polishing selectivity of 1:10~1:200 between a nitride layer and a polysilicon layer, until the bit line hard mask nitride layer 16 of each bit line 17 is exposed. In this way, the second polysilicon layer 20 for a hard mask is left on the second interlayer insulation layer 19 between the bit lines 17.

Figure 1E:
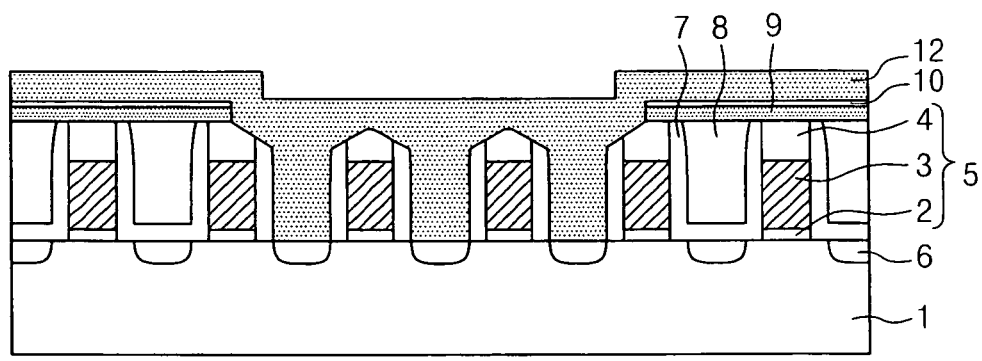
Figure 1F:
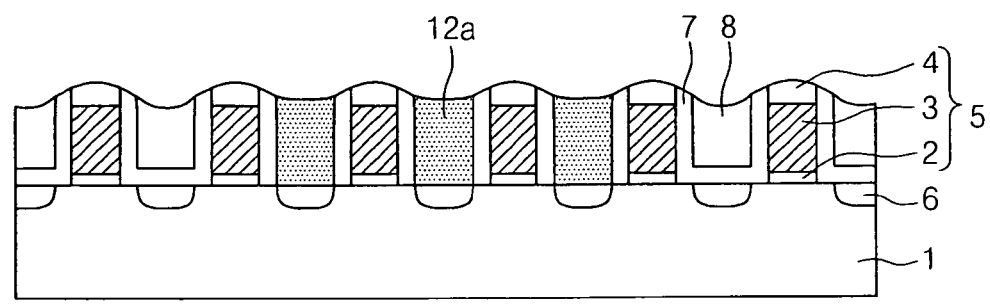
Figure 2:
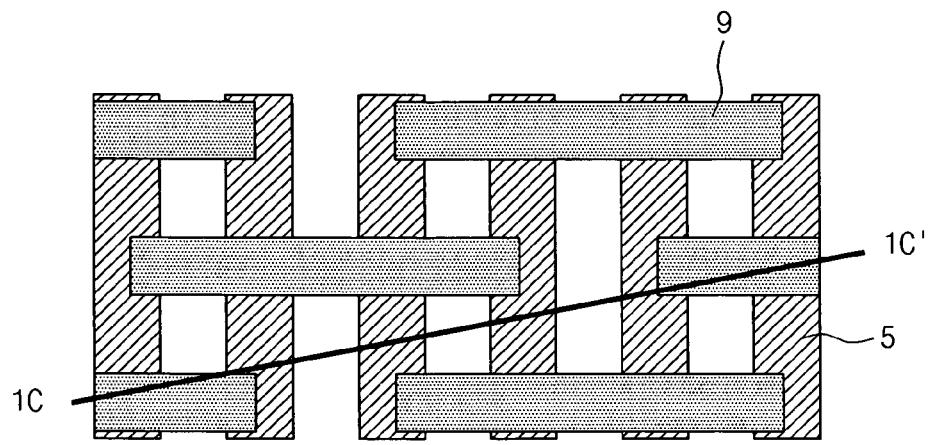
FIG. 2 is a plan view corresponding to FIG. 1C.
Figure 3A:
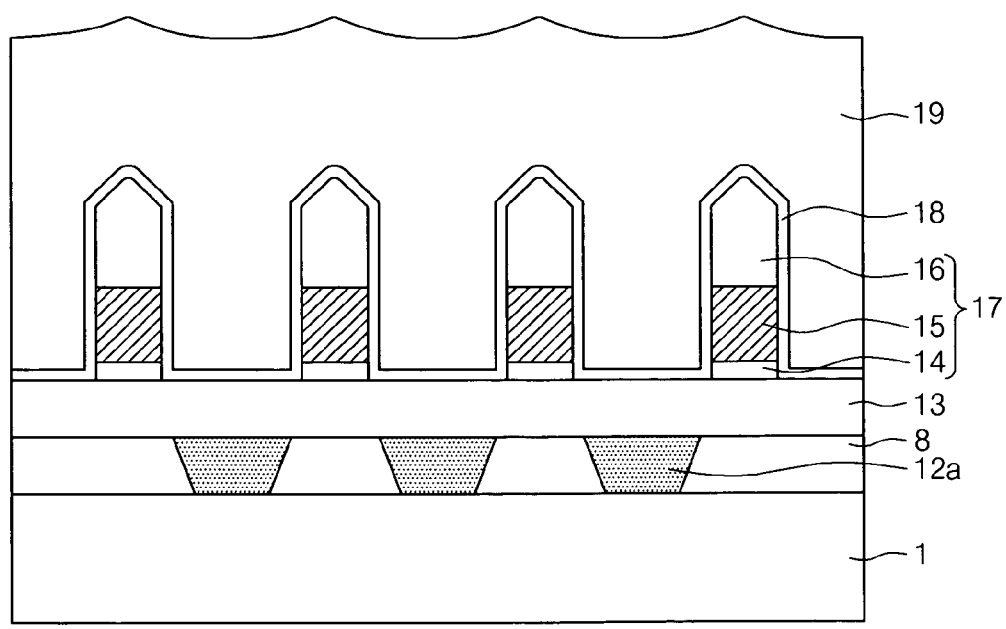
FIGS. 3A through 3E are cross-sectional views illustrating the process steps of a conventional method for forming a storage node contact.
Figure 3B:
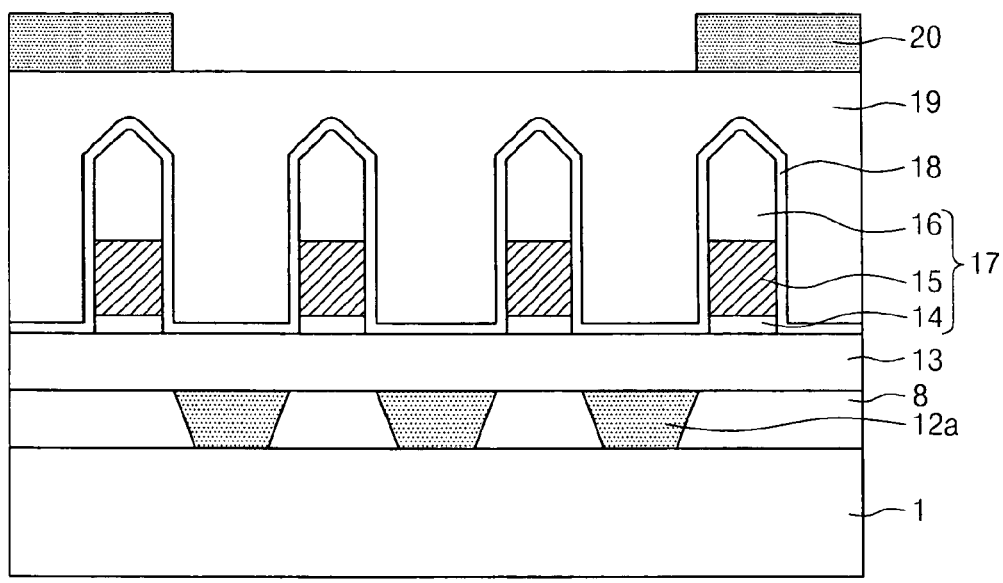
Figure 3C:
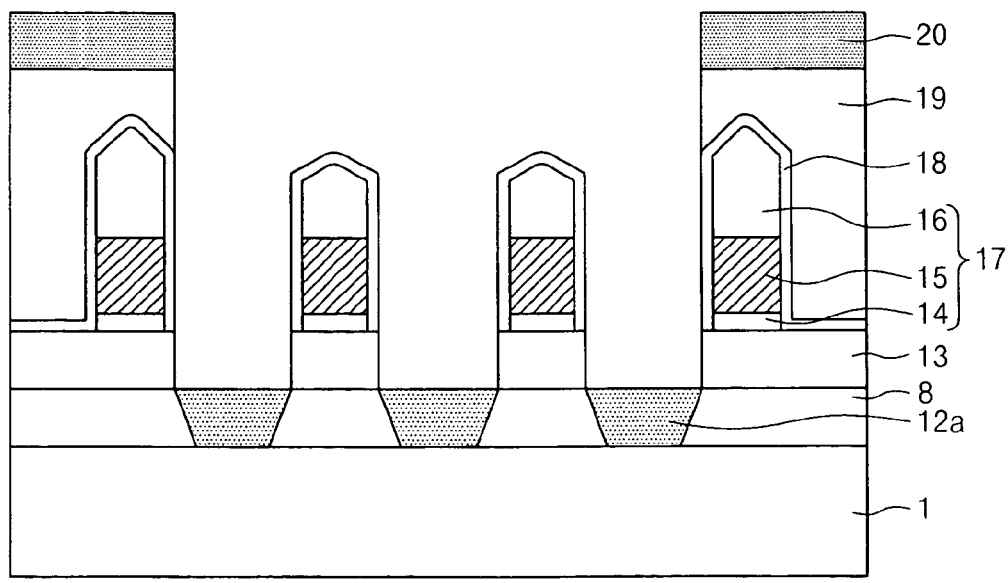
Figure 3D:
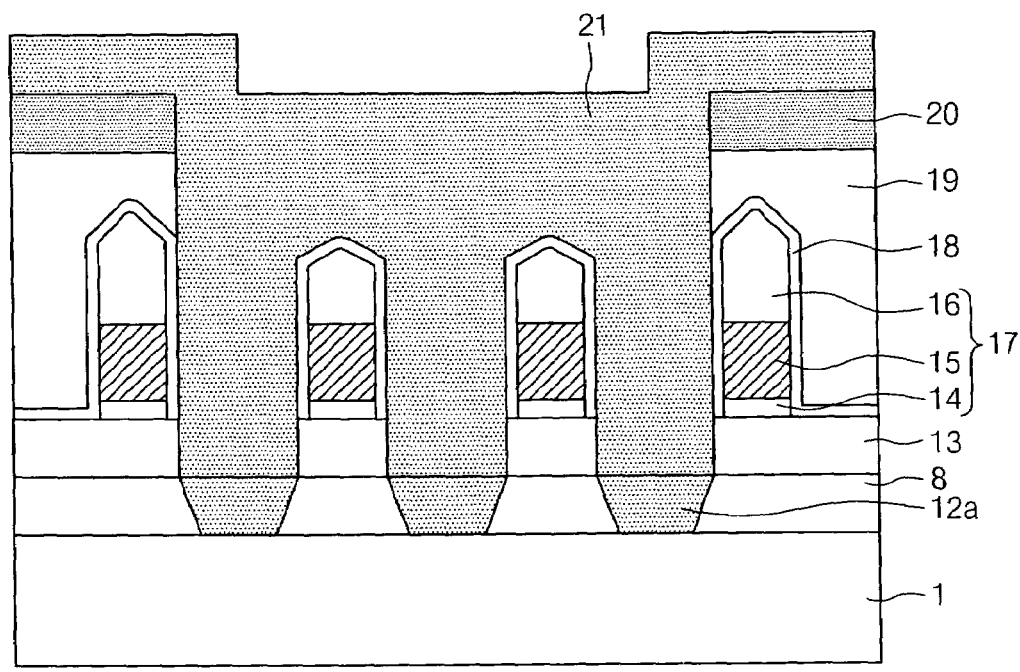
Figure 3E:
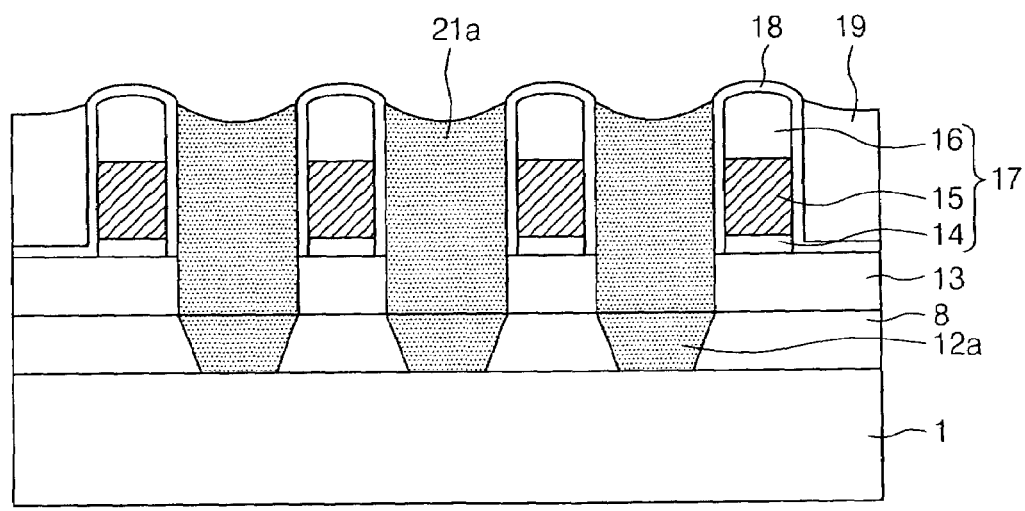
Figure 4:
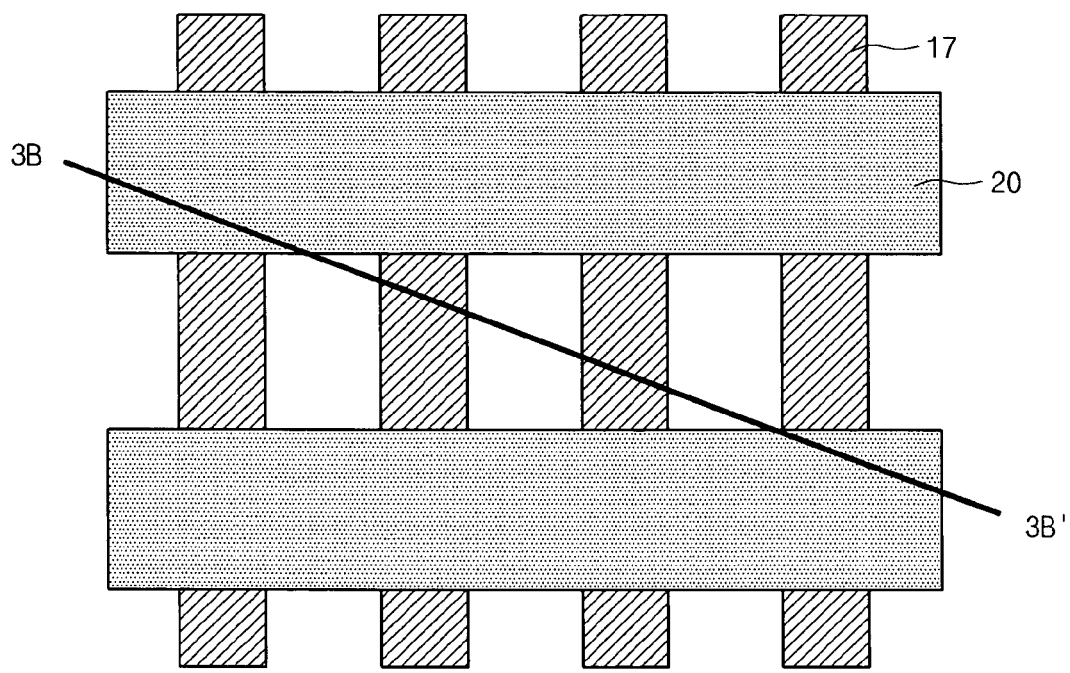
FIG. 4 is a plan view corresponding to FIG. 3B.
Figure 5:
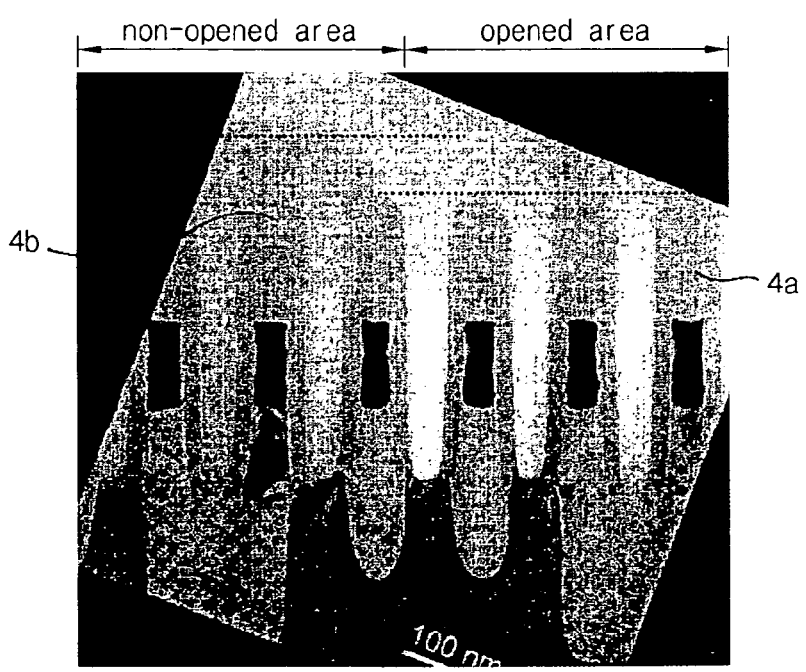
FIG. 5 is a photograph illustrating a thickness deviation in a nitride layer for a gate line hard mask between an opened area and a non-opened area after an interlayer insulation layer is etched in the conventional method for forming a landing plug contact.
Figure 6:
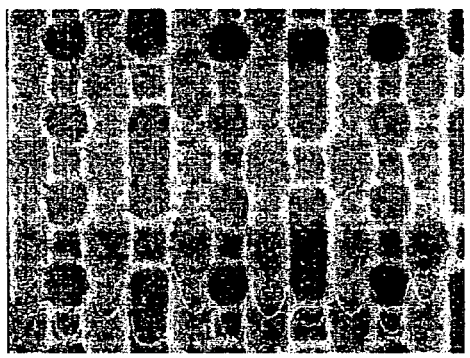
FIG. 6 is photographs illustrating a contact loss difference induced in a wafer after conducting a CMP process for isolating landing plug contacts in the conventional method.
Figure 6:
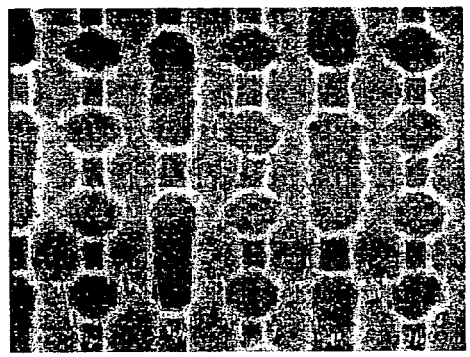
Figure 7:
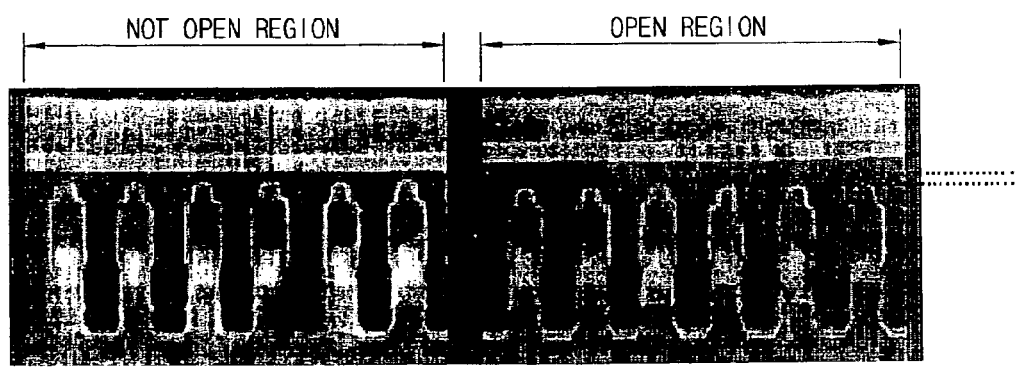
FIG. 7 is a photograph illustrating a thickness deviation in a nitride layer for a bit line hard mask between an opened area and a non-opened area in the conventional method for forming a storage node contact.
Figure 8:
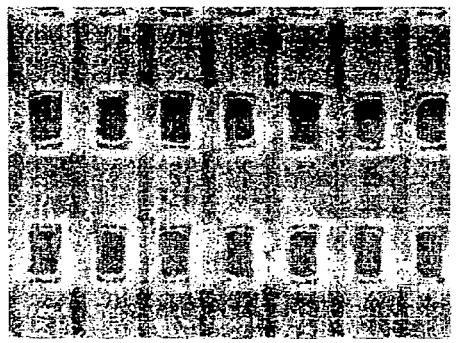
FIG. 8 is photographs illustrating a contact loss difference induced in a wafer after conducting a CMP process for isolating storage node contacts in the conventional method.
Figure 8:
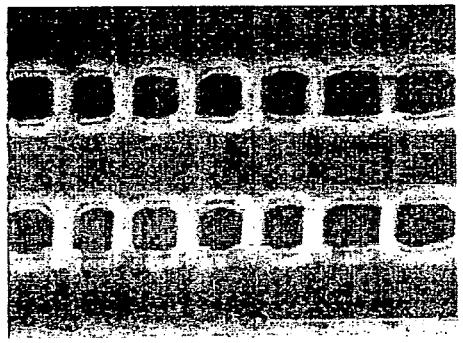

Referring to FIG. 1E, a mask pattern (not shown) for exposing storage node contact 21a forming regions is formed on the resultant substrate 1 with the CMPed second polysilicon layer 20 for a hard mask, by implementing a conventional process. At this time, the mask pattern is formed in the shape of a line. Then, the second polysilicon layer 20 for a hard mask is etched using the mask pattern as an etch mask to form a second polysilicon hard mask pattern 20a. Thereupon, after removing the mask pattern, the second interlayer insulation layer 19 and the insulation layer 13 are etched using the second polysilicon hard mask pattern 20a as an etch barrier to expose the landing plug contacts 12a between the bit lines 17 in the storage node contact 21a forming regions.

Figure 12:
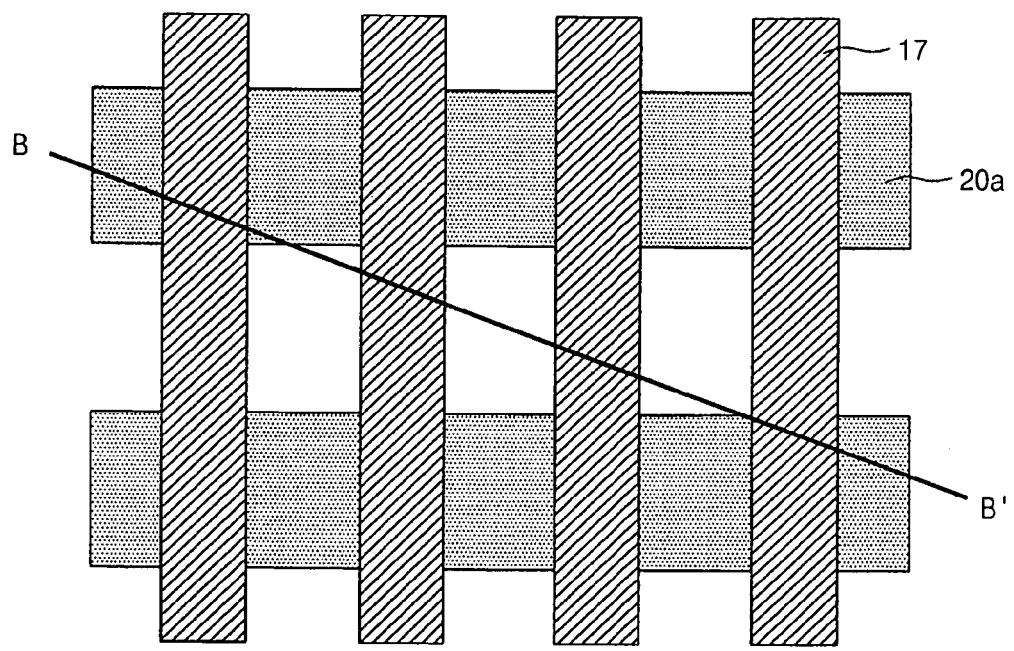
FIG. 12 is a plan view corresponding to FIG. 11E.

Here, as can be readily seen from FIG. 12, in an embodiment of the present invention, since the second polysilicon hard mask pattern 20a is not formed on the bit line hard mask nitride layer 16 of each gate line 17 and is only formed on the portions of the second interlayer insulation layer 19 which will not be opened, the entire bit lines 17 are exposed. Also, because the entire bit lines 17 are exposed, when implementing an etching process for forming storage node contacts 21a, the loss of the bit line hard mask nitride layer 16 occurs to the same extent over the entire bit lines 17. Therefore, in an embodiment of the present invention, it is possible to minimize a thickness deviation of the bit line hard mask nitride layer 16 in the bit lines 17.

Figure 11F:
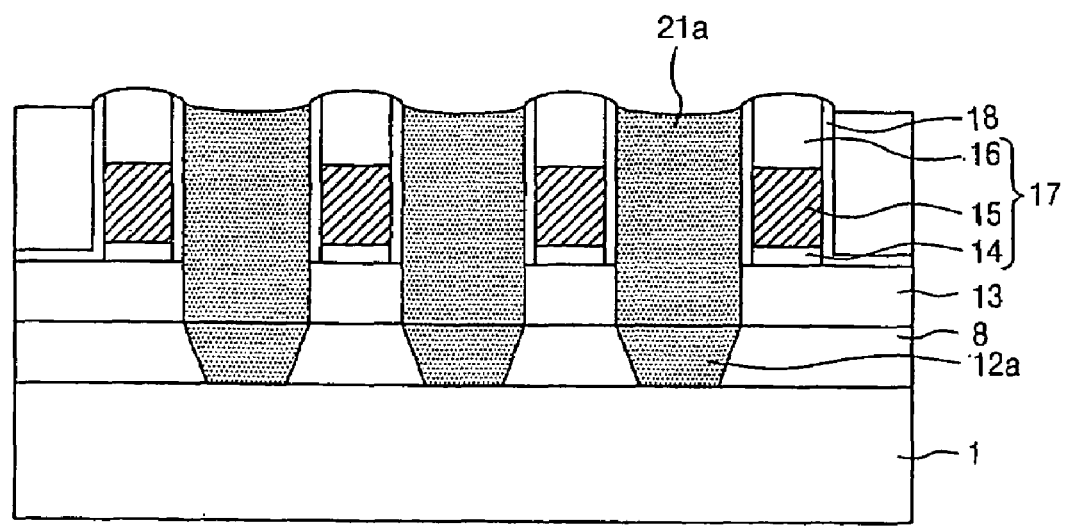

Referring to FIG. 11F, a polysilicon layer or a tungsten layer which is made of a conductive material and serves as a conductive layer for a plug is deposited on the resultant substrate 1 to fill the opened regions. Then, the polysilicon layer and the remaining second polysilicon hard mask pattern 20a are removed through a CMP process to expose the bit line hard mask nitride layer 16 of each gate line 17, as a result of which storage node contacts 21a are formed between the bit lines 17 to be connected to the landing plug contacts 12a. At this time, it is possible to use an etch-back process instead of the CMP process.

Therefore, in an embodiment of the present invention, since the thickness deviation of the bit line hard mask nitride layer 16 in the bit lines 17 is minimized, a polishing thickness can be minimized when CMPing the polysilicon layer. As a consequence, in an embodiment of the present invention, as the remaining thickness of the bit line hard mask nitride layer 16 can be stably secured, it is possible to minimize the polishing thickness of the conductive layer for a plug, and the uniformity of a wafer can be improved.

As is apparent from the above description, the method for forming a contact of a semiconductor device according to an embodiment of the present invention provides advantages in that, when forming landing plug contacts 12a and storage node contacts 21a, since a polysilicon hard mask pattern is formed to expose entire gate lines and bit lines, it is possible to minimize the thickness deviation of a hard mask nitride layer in the gate lines and bit lines.

As a consequence, due to the fact that the thickness deviation of the hard mask nitride layer is minimized, the polishing thickness of a conductive layer for a plug which is subsequently formed can also be minimized. Therefore, the uniformity of the wafer is improved, and the characteristics and reliability of the semiconductor device can be enhanced.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a contact in a semiconductor device having a substrate comprising the steps of:

forming a plurality of conductive lines on the substrate, each conductive line comprising a first hard mask layer;

forming an interlayer insulation layer on the substrate having the conductive lines;

performing a first CMP process on the interlayer insulation layer to expose at least the top portion of the first hard mask layer of each conductive line;

after performing the first CMP process, further removing a predetermined thickness of the interlayer insulation layer;

after removing the predetermined thickness of the interlayer insulation layer, forming a second hard mask layer thereon;

performing a second CMP process on the second hard mask layer to expose at least the top portion of the first hard mask layer of each conductive line such that a plurality of portions of the second hard mask layers is formed, each portion remaining between adjacent conductive lines;

etching selected portions of the second hard mask layer by which a second hard mask pattern is formed and defines contact forming regions on the substrate;

etching the interlayer insulation layers using the second hard mask pattern as an etch barrier to open the contact forming regions of the substrate;

after etching the insulation layers using the second hard mask pattern as an etch barrier, depositing a conductive layer thereon filling the opened contact forming regions; and removing a predetermined thickness of the conductive layer and the second hard mask pattern to expose the first hard mask layer of each conductive line.

2. The method as set forth in claim 1, wherein each of the conductive lines is either a gate line or a bit line.

3. The method as set forth in claim 1, wherein the opened contact forming regions are junction regions, each of which is formed between the adjacent conductive lines that are gate lines.

4. The method as set forth in claim 1, wherein the opened contact forming regions are landing plug contact regions, each of which is formed between the adjacent conductive lines that are bit lines.

5. The method as set forth in claim 1, wherein the predetermined thickness removed from the interlayer insulation layer is any thickness in the range of 100~1,000 Å.

6. The method as set forth in claim 1, wherein the first hard mask layer comprises a nitride layer, and wherein the interlayer insulation layer comprises an oxide layer, and wherein the second hard mask layer comprises a polysilicon layer.

7. The method as set forth in claim 1, wherein the first CMP process is implemented using a slurry having a polishing selectivity of the first hard mask layer to the interlayer insulation layer of 1:10~1:200.

8. The method as set forth in claim 7, wherein the first hard mask layer comprises a nitride layer, and wherein the interlayer insulation layer comprises an oxide layer.

9. The method as set forth in claim 1, wherein the second CMP process is implemented using a slurry having a polishing selectivity of the first hard mask layer to the second hard mask layer of 1:10~1:200.

10. The method as set forth in claim 9, wherein the first hard mask layer comprises a nitride layer, and wherein the second hard mask layer comprises a polysilicon layer.

11. The method as set forth in claim 1, wherein the conductive layer for filling the opened contact forming regions comprises polysilicon for forming landing plug contacts.

12. The method as set forth in claim 1, wherein the conductive layer for filling the opened contact forming regions is made of polysilicon or tungsten forming storage node contacts.

13. The method as set forth in claim 1, wherein the step of removing the predetermined thickness of the conductive layer and the second hard mask pattern is implemented by an etchback process or a CMP process.

14. A method of forming a contact for a semiconductor device having a substrate comprising the steps of:

forming a plurality of gate lines on the substrate, each gate line comprising a first hard mask layer, wherein a plurality of junction regions are formed on the substrate, each junction region formed between adjacent gate lines;

forming an interlayer insulation layer on the substrate to cover the gate lines and the junction regions;

performing a first CMP process on the interlayer insulation layer to expose at least the top portion of the first hard mask layer of each gate line;

after performing the first CMP process, further removing a predetermined thickness of the interlayer insulation layer;

after removing the predetermined thickness of the interlayer insulation layer, forming a second hard mask layer thereon;

performing a second CMP process on the second hard mask layer to expose at least the top portion of the first hard mask layer of each gate line such that a plurality of Portions of the second hard mask layers is formed, each portion remaining between adjacent gate lines;

etching selected portions of the second hard mask layer by which a second hard mask pattern is formed and defines contact forming regions on the substrate;

etching the interlayer insulation layer using the second hard mask pattern as an etch barrier to open the contact forming regions, each of which is formed between the adjacent gate lines;

after etching the insulation layers using the second hard mask pattern as an etch barrier, depositing a conductive layer thereon filling the opened contact forming regions; and removing a predetermined thickness of the conductive layer and the second hard mask pattern to expose the first hard mask layer of each gate line.

15. The method as set forth in claim 14, wherein the predetermined thickness removed from the interlayer insulation layer is any thickness in the range of 300~1,000 Å.

16. The method as set forth in claim 14, wherein the first hard mask layer comprises a nitride layer, and wherein the interlayer insulation layer comprises an oxide layer, and wherein the second hard mask layer comprises a polysilicon layer.

17. The method as set forth in claim 14, wherein the first CMP process is implemented using a slurry having a polishing selectivity of the first hard mask layer to the interlayer insulation layer of 1:10~1:200.

18. The method as set forth in claim 17, wherein the first hard mask layer comprises a nitride layer, and wherein the interlayer insulation layer comprises an oxide layer.

19. The method as set forth in claim 14, wherein the second CMP process is implemented using a slurry having a polishing selectivity of the first hard mask layer to the second hard mask layer of 1:10~1:200.

20. The method as set forth in claim 19, wherein the first hard mask layer comprises a nitride layer, and wherein the second hard mask layer comprises a polysilicon layer.

21. The method as set forth in claim 14, wherein the conductive layer for filling the opened contact forming regions comprises polysilicon.

22. The method as set forth in claim 14, wherein the step of removing the predetermined thickness of the conductive layer and the second hard mask pattern is implemented by an etchback process or a CMP process.

23. A method of forming a contact for a semiconductor device having a substrate comprising the steps of:

forming a plurality of bit lines on the substrate, each bit line comprising a first hard mask layer;

forming an interlayer insulation layer on the substrate to cover the bit lines;

performing a first CMP process on the interlayer insulation layer to expose at least the top portion of the first hard mask layer of each bit line;

after performing the first CMP process, further removing a predetermined thickness of the interlayer insulation layer;

after removing the predetermined thickness of the interlayer insulation layer, forming a second hard mask layer thereon;

performing a second CMP process on the second hard mask layer to expose at least the top portion of the first hard mask layer of each bit line such that a plurality of portions of the second hard mask layers is formed, each portion remaining between adjacent bit lines;

etching selected portions of the second hard mask layer by which a second hard mask pattern is formed and defines contact forming regions;

etching the interlayer insulation layer using the second hard mask pattern as an etch barrier to open the contact forming regions, each of which is formed between the adjacent bit lines;

after etching the insulation layers using the second hard mask pattern as an etch barrier, depositing a conductive layer thereon filling the opened contact forming regions; and removing a predetermined thickness of the conductive layer and the second hard mask pattern to expose the first hard mask layer of each bit line.

24. The method as set forth in claim 23, wherein the predetermined thickness removed from the interlayer insulation layer is any thickness in the range of 100~1,000 Å.

25. The method as set forth in claim 23, wherein the first hard mask layer comprises a nitride layer, and wherein the interlayer insulation layer comprises an oxide layer, and wherein the second hard mask layer comprises a polysilicon layer.

26. The method as set forth in claim 23, wherein the first CMP process is implemented using a slurry having a polishing selectivity of the first hard mask layer to the interlayer insulation layer of 1:10~1:200.

27. The method as set forth in claim 26, wherein the first hard mask layer comprises a nitride layer, and wherein the interlayer insulation layer comprises an oxide layer.

28. The method as set forth in claim 23, wherein the second CMP process is implemented using a slurry having a polishing selectivity of the first hard mask layer to the second hard mask layer of 1:10~1:200.

29. The method as set forth in claim 28, wherein the first hard mask layer comprises a nitride layer, and wherein the second hard mask layer comprises a polysilicon layer.

30. The method as set forth in claim 23, wherein the conductive layer for filling the opened contact forming regions comprises polysilicon or tungsten.

31. The method as set forth in claim 23, wherein the step of removing the predetermined thickness of the conductive layer and the second hard mask pattern is implemented by an etchback process or a CMP process.

32. The method as set forth in claim 1, wherein the step of removing a predetermined thickness of the interlayer insulation layer is implemented such that only an upper portion of each first hard mask layer is exposed.

33. The method as set forth in claim 14, wherein the step of removing a predetermined thickness of the interlayer insulation layer is implemented such that only an upper portion of each first hard mask layer is exposed.

34. The method as set forth in claim 23, wherein the step of removing a predetermined thickness of the interlayer insulation layer is implemented such that only an upper portion of each first hard mask layer is exposed.

* * * * *